United States Patent
Hayashi

(10) Patent No.: US 12,336,344 B2
(45) Date of Patent: Jun. 17, 2025

(54) METHOD OF MANUFACTURING LIGHT EMITTING DEVICE

(71) Applicant: NICHIA CORPORATION, Anan (JP)

(72) Inventor: Hirosuke Hayashi, Naruto (JP)

(73) Assignee: NISSAN NORTH AMERICA, INC., Franklin, TN (US)

( * ) Notice: Subject to any disclaimer, the term of this patent is extended or adjusted under 35 U.S.C. 154(b) by 0 days.

(21) Appl. No.: 18/446,382

(22) Filed: Aug. 8, 2023

(65) Prior Publication Data

US 2023/0387361 A1    Nov. 30, 2023

Related U.S. Application Data

(60) Division of application No. 17/852,327, filed on Jun. 28, 2022, now Pat. No. 11,764,338, which is a
(Continued)

(30) Foreign Application Priority Data

Jan. 15, 2018    (JP) .................................. 2018-003910

(51) Int. Cl.
*H10H 20/856*    (2025.01)
*H10H 20/85*    (2025.01)
(Continued)

(52) U.S. Cl.
CPC .... *H10H 20/8515* (2025.01); *H10H 20/8506* (2025.01); *H10H 20/8513* (2025.01);
(Continued)

(58) Field of Classification Search
CPC ..... H01L 33/507; H01L 33/486; H01L 33/60; H01L 2933/0033; H01L 2933/0041;
(Continued)

(56) References Cited

U.S. PATENT DOCUMENTS 6,345,903 B1    2/2002  Koike et al.
8,513,872 B2    8/2013  Annen et al.
(Continued)

FOREIGN PATENT DOCUMENTS

JP    2001-308393 A    11/2001
JP    2013-012545 A    1/2013
JP    2016-001735 A    1/2016

OTHER PUBLICATIONS

Restriction Requirement in the related U.S. Appl. No. 16/246,679, dated Nov. 19, 2019.
(Continued)

*Primary Examiner* — Eugene Lee
(74) *Attorney, Agent, or Firm* — Global IP Counselors, LLP

(57) ABSTRACT

A method of manufacturing a light emitting device includes: providing a light emitting structure including a light emitting element having a top surface and lateral surfaces, a wavelength conversion member having a top surface, a bottom surface, and lateral surfaces, with the bottom surface of the wavelength conversion member facing the top surface of the light emitting element, and a reflecting member surrounding the lateral surfaces of the light emitting element and the lateral surfaces of the wavelength conversion member, the reflecting member having a top surface; and supplying a covering member to cover the top surface of the wavelength conversion member and the top surface of the reflecting member, the covering member containing at least one of a pigment and a dye so that a body color of the covering member is the same or a similar color as a body color of the wavelength conversion member.

7 Claims, 10 Drawing Sheets

Related U.S. Application Data continuation of application No. 16/246,679, filed on Jan. 14, 2019, now Pat. No. 11,404,615.

(51) Int. Cl.
  *H10H 20/851* (2025.01)
  *H10H 20/01* (2025.01)
  *H10H 20/80* (2025.01)

(52) U.S. Cl.
  CPC ......... *H10H 20/856* (2025.01); *H10H 20/036* (2025.01); *H10H 20/0361* (2025.01); *H10H 20/0363* (2025.01); *H10H 20/882* (2025.01)

(58) Field of Classification Search
  CPC ........ H01L 2933/0058; H10H 20/8515; H10H 20/8506; H10H 20/8513; H10H 20/856
  See application file for complete search history.

(56) References Cited

U.S. PATENT DOCUMENTS

| | | | |
|---|---|---|---|
| 8,822,032 | B2 | 9/2014 | Borrelli et al. |
| 8,994,045 | B2 | 3/2015 | Negley |
| 10,084,118 | B2 | 9/2018 | Yun et al. |
| 10,741,734 | B2 | 8/2020 | Cheng et al. |
| 11,296,262 | B2 | 4/2022 | Shen et al. |
| 2002/0039001 | A1 | 4/2002 | Nagai et al. |
| 2006/0099449 | A1 | 5/2006 | Amano et al. |
| 2006/0226759 | A1 | 10/2006 | Masuda et al. |
| 2008/0179503 | A1 | 7/2008 | Camargo et al. |
| 2009/0014736 | A1 | 1/2009 | Ibbetson et al. |
| 2009/0057690 | A1 | 3/2009 | Chakraborty |
| 2010/0244061 | A1* | 9/2010 | Shirakawa ................ F21K 9/00 257/E33.056 |
| 2011/0006334 | A1 | 1/2011 | Ishii et al. |
| 2011/0254039 | A1 | 10/2011 | Kim et al. |
| 2012/0007130 | A1 | 1/2012 | Hoelen et al. |
| 2013/0207130 | A1 | 8/2013 | Reiherzer |
| 2013/0256711 | A1 | 10/2013 | Joo et al. |
| 2014/0057375 | A1 | 2/2014 | Miller et al. |
| 2014/0217433 | A1 | 8/2014 | Tudorica et al. |
| 2014/0367633 | A1 | 12/2014 | Bibi et al. |
| 2015/0188004 | A1* | 7/2015 | Ozeki ................ H01L 25/0753 438/27 |
| 2015/0340547 | A1 | 11/2015 | Tamaki |
| 2016/0351762 | A1 | 12/2016 | Sato |
| 2017/0033267 | A1* | 2/2017 | Tamaki ................ H01L 33/508 |
| 2017/0040499 | A1 | 2/2017 | Ushiyama et al. |
| 2017/0133357 | A1* | 5/2017 | Kuo ...................... H01L 25/167 |
| 2017/0205565 | A1* | 7/2017 | Akagawa ............. G02B 6/0073 |
| 2017/0278829 | A1* | 9/2017 | Stoll ..................... H01L 33/507 |
| 2017/0331003 | A1* | 11/2017 | Cheng ..................... H01L 33/22 |
| 2018/0033924 | A1 | 2/2018 | Andrews et al. |
| 2018/0047780 | A1 | 2/2018 | Yeon et al. |
| 2018/0259137 | A1* | 9/2018 | Lee .......................... F21S 10/02 |
| 2018/0358516 | A1* | 12/2018 | Pust ....................... H01L 33/56 |
| 2019/0103525 | A1* | 4/2019 | Bando ..................... H01L 33/50 |
| 2020/0144327 | A1 | 5/2020 | Lee et al. |
| 2021/0183827 | A1 | 6/2021 | Maegawa et al. |

OTHER PUBLICATIONS

Non Final OA in the related U.S. Appl. No. 16/246,679, dated Feb. 19, 2020.
Final OA in the related U.S. Appl. No. 16/246,679, dated Jun. 25, 2020.
Advisory Action in the related U.S. Appl. No. 16/246,679, dated Oct. 21, 2020.
Non Final OA in the related U.S. Appl. No. 16/246,679, dated May 17, 2021.
Final OA in the related U.S. Appl. No. 16/246,679, dated Jun. 23, 2021.
Advisory Action in the related U.S. Appl. No. 16/246,679, dated Sep. 28, 2021.
Notice of Allowance in the related U.S. Appl. No. 17/852,327, dated Dec. 14, 2022.

* cited by examiner

METHOD OF MANUFACTURING LIGHT EMITTING DEVICE

CROSS-REFERENCE TO RELATED APPLICATIONS

This application is a divisional application of U.S. patent application Ser. No. 17/852,327, filed on Jun. 28, 2022, which is a continuation application of U.S. patent application Ser. No. 16/246,679, filed on Jan. 14, 2019, now U.S. Pat. No. 11,404,615. This application claims priority to Japanese Patent Application No. 2018-003910 filed on Jan. 15, 2018. The entire disclosures of U.S. patent application Ser. Nos. 17/852,327 and 16/246,679 and Japanese Patent Application No. 2018-003910 are hereby incorporated herein by reference.

The present disclosure relates to a light emitting device and a method of manufacturing a light emitting device.

BACKGROUND

For example, noted in Japanese Laid-Open Patent Publication No. 2013-12545 is a light emitting device for which a phosphor plate is adhered on a light emitting element, and the periphery is covered with a light reflective white member. The top surface of such light emitting device is configured by two colors, the color of the phosphor contained in the phosphor plate (e.g., yellow) and the color of the white member (i.e., white).

SUMMARY

With conventional light emitting devices, for example when used as a light source of an lighting device such as a flash light of a smart phone camera, the color of the phosphor and the color of the white member appear on the lens during non-light emission. For that reason, depending on the design of the smart phone or its cover, with conventional light emitting devices, for example, the top surface of the light emitting device has a part different color from the wavelength conversion member, during non-light emission. Thus, the external appearance of the lens is not very good.

Accordingly, certain embodiments of the present disclosure provide a light emitting device and a manufacturing method thereof for which the contrast between the light emitting region and the non-light emitting region during light emission is large, and the entire top surface of the light emitting device during non-light emission has the color the same as or similar to the color of the wavelength conversion member.

A method of manufacturing a light emitting device according to one embodiment includes: providing a light emitting structure including a light emitting element having a top surface and lateral surfaces, a wavelength conversion member having a top surface, a bottom surface, and lateral surfaces, with the bottom surface of the wavelength conversion member facing the top surface of the light emitting element, and a reflecting member surrounding the lateral surfaces of the light emitting element and the lateral surfaces of the wavelength conversion member, the reflecting member having a top surface; and supplying a covering member to cover the top surface of the wavelength conversion member and the top surface of the reflecting member, the covering member containing at least one of a pigment and a dye so that a body color of the covering member is the same or a similar color as a body color of the wavelength conversion member.

A method of manufacturing a light emitting device according to one embodiment includes: providing a light emitting element having a first surface, a second surface on an opposite side to the first surface, and lateral surfaces between the first surface and the second surface; providing a wavelength conversion member having a first surface, a second surface on an opposite side to the first surface, and lateral surfaces between the first surface and the second surface; providing a covering member having a first surface, and a second surface on an opposite side to the first surface, the covering member containing at least one of a pigment and a dye so that a body color of the covering member is the same or a similar color as a body color of the wavelength conversion member; placing the wavelength conversion member with the first surface of the wavelength member facing the second surface of the covering member; placing the light emitting element with the first surface of the light emitting element facing the second surface of the wavelength conversion member; and supplying the reflecting member to surround the lateral surfaces of the wavelength conversion member and the lateral surfaces of the light emitting element, and to cover the second surface of the covering member.

With the light emitting device of the embodiments of the present embodiment it is possible to have a large contrast between the light emitting region and the non-light emitting region during light emission, and possible to have the entire top surface of the light emitting device be the same as or similar to the color of the wavelength conversion member during non-light emission. With the manufacturing method of the light emitting device of the embodiment of the present disclosure, it is possible to obtain a light emitting device having large contrast between the light emitting region and the non-light emitting region during light emission, and having the entire top surface of the light emitting device is the same or similar color to the color of the wavelength conversion member during non-light emission.

DETAILED DESCRIPTION OF EMBODIMENTS

Figure 1A:
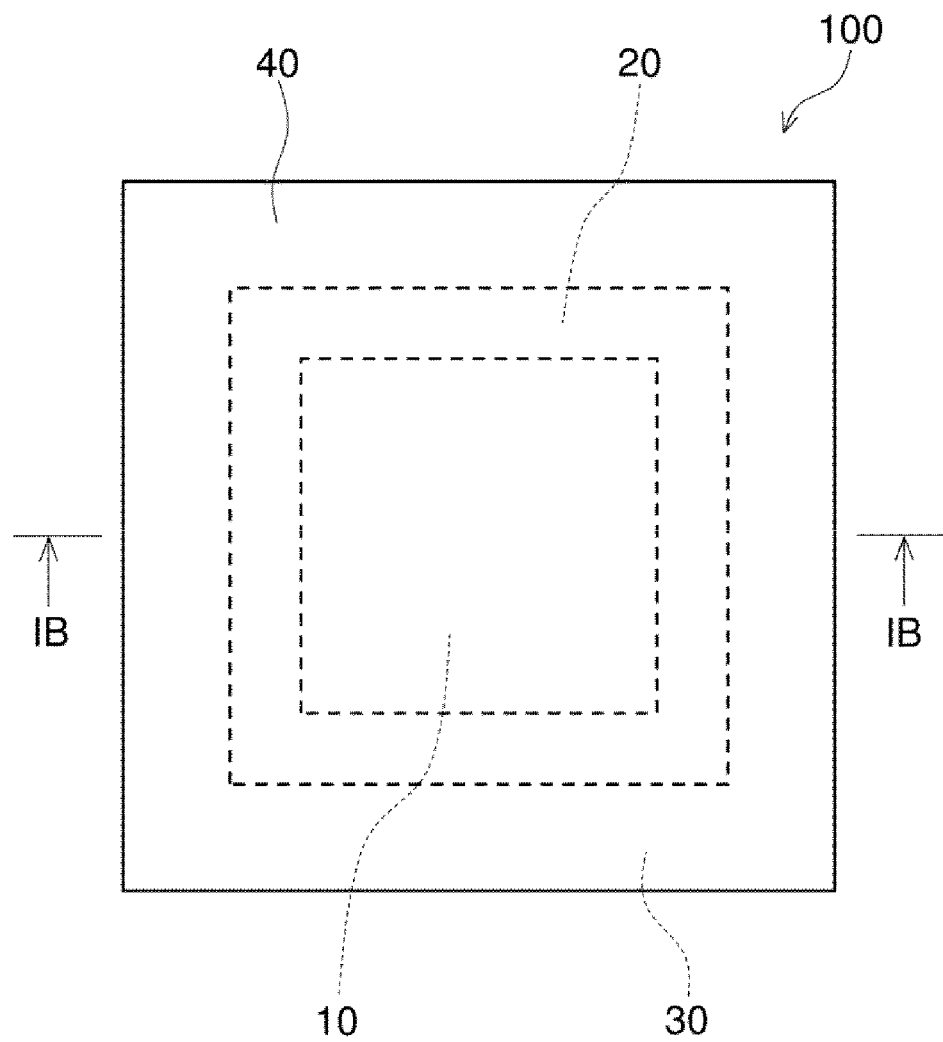
FIG. 1A is a schematic top view of a light emitting device of an embodiment of the present disclosure.

Following, embodiments of the disclosure are explained while referring to the drawings as appropriate. However, the light emitting device and manufacturing method thereof explained hereafter are for putting into specific form the technical concept of the present disclosure, and unless specifically noted, the present disclosure is not limited to the items hereafter. The contents explained with one embodiment can be used for other embodiments as well. Also, the size and positional relationship, etc., of the members shown in the drawings may be exaggerated to clarify the explanation.

Embodiment 1

Light Emitting Device 100

Figure 1B:
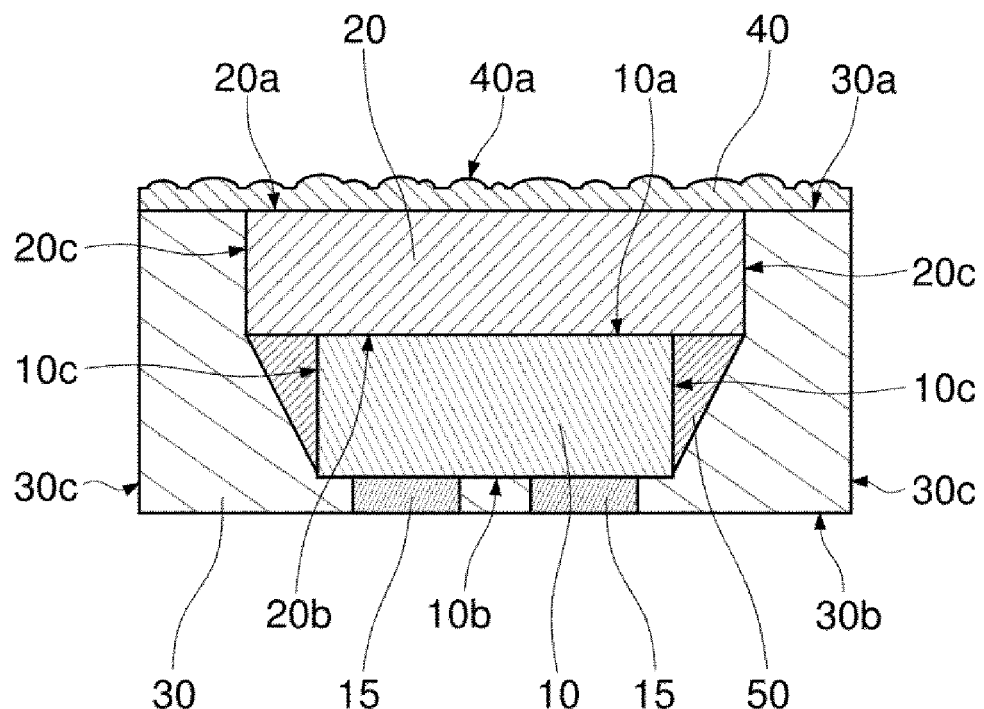
FIG. 1B is a schematic cross section view of line IB-IB of the light emitting device shown in FIG. 1A.

FIG. 1A is a schematic top view of a light emitting device 100 of Embodiment 1. FIG. 1B is a schematic cross section view of line IB-IB of the light emitting device 100 shown in FIG. 1A.

As shown in FIGS. 1A and 1B, the light emitting device 100 of Embodiment 1 comprises a light emitting element 10, a wavelength conversion member 20, a reflecting member 30, and a covering member 40. Also, the light emitting device 100 of Embodiment 1 further comprises electrodes 15 and a light guide member 50. The light emitting element 10 has a top surface 10a, a bottom surface 10b, and lateral surfaces 10c. The electrodes 15 are configured by a positive and negative pair, and are respectively connected to the bottom surface 10b of the light emitting element. The wavelength conversion member 20 has a top surface 20a, a bottom surface 20b, and a lateral surfaces 20c. The wavelength conversion member 20 is provided with the bottom surface 20b facing the top surface 10a of the light emitting element. The reflecting member 30 has a top surface 30a, a bottom surface 30b, and lateral surfaces 30c. The reflecting member 30 covers the bottom surface 10b and the lateral surface 10c sides of the light emitting element and the lateral surface 20c of the wavelength conversion member. In more detail, the reflecting member 30 covers the lateral surfaces 10c of the light emitting element with the light guide member 50 interposed. The bottom surface 30b and the lateral surfaces 30c of the reflecting member configure the outer surface of the light emitting device 100. The bottom surface 30b of the reflecting member configures a plane which is also configured by the bottom surface of the electrodes 15. The covering member 40 covers the top surface 20a of the wavelength conversion member and the top surface 30a of the reflecting member. The covering member 40 contains a pigment or a dye. The body color of the wavelength conversion member 20 and the body color of the covering member 40 are of a similar color.

The light emitting device 100 having such configuration can have the contrast (i.e., difference in brightness) between the light emitting region and the non-light emitting region during light emission be large, and the entire top surface of the light emitting device can be the same or similar to the color of the wavelength conversion member 20 during non-light emission. Also, using the covering member 40, it is possible to protect the wavelength conversion substance in the wavelength conversion member 20 from the outside environment.

In this specification, the "light emitting region" of the top surface of the light emitting device is, for example, the region positioned directly above the top surface 20a of the wavelength conversion member. Also, the "non-light emitting region" of the top surface of the light emitting device is, for example, the region positioned directly above the top surface 30a of the reflecting member.

Figure 2:
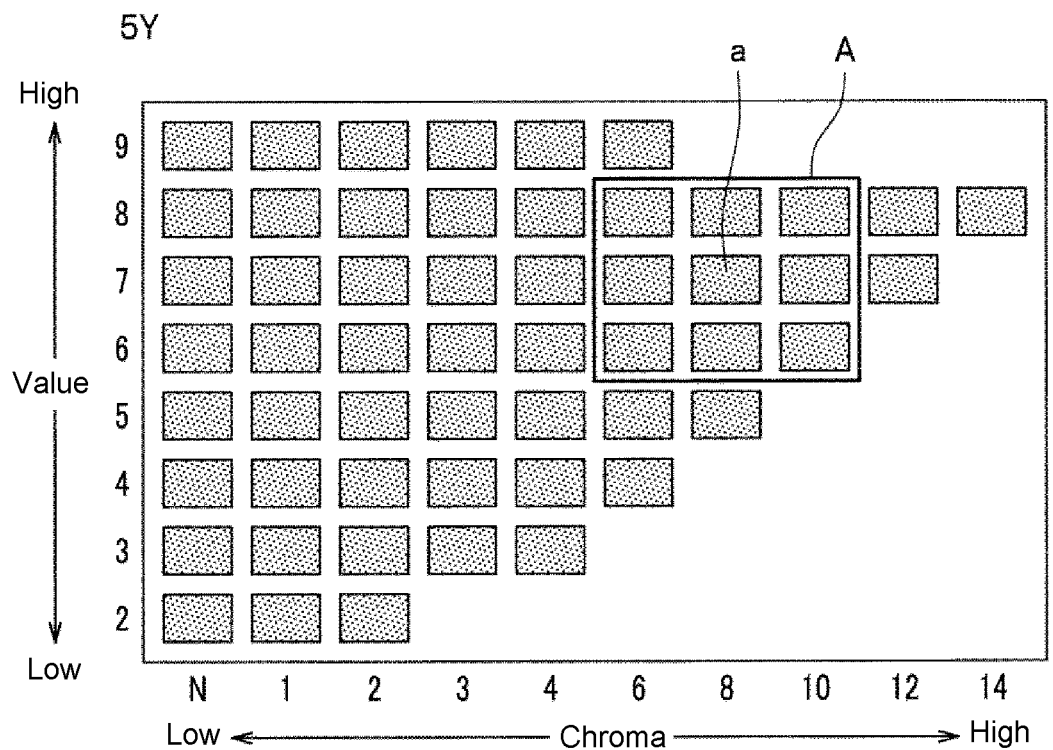
FIG. 2 is a chart schematically showing a constant hue plane of a hue (5Y) of the Munsell color system.

Also, the "same or similar color" to a given color in this specification refers that the hue is within 3 ranges of the color wheel with the given color being in the middle, the lightness (value) is within 3 ranges with the given color being in the middle, and the chroma is within 3 ranges with the given color being in the middle, in the Munsell color system (20 hues). Specifically, in the Munsell color wheel of the Munsell color system (20 hues), the "same or similar color" in this specification includes adjacent color hues on both sides of the given color. Similarly, in a constant hue plane of the Munsell color system (20 hues), the "same or similar lightness" in this specification includes value of ±1 from a given lightness, and the "same or similar chroma" in this specification includes value of ±1 from a given chroma. More specifically, as shown in FIG. 2, for example, assuming that a certain color having a Y (yellow) hue as color a of the constant hue plates (5Y) in the Munsell color system shown in FIG. 2, those in a range A are defined as similar colors to the color a.

"Having the entire top surface of the light emitting device being the same or similar color of the wavelength conversion member during non-light emission" includes a case where the color of the entire top surface of the light emitting device is the same as the color of the wavelength conversion member, as well as other cases of the equivalent level. "The equivalent level" can be, for example, having the hue, the lightness, and the chroma be to adjacent sides in a constant hue plane of the Munsell color system (20 hues) as described above.

For measurement of the body color, for example, it is possible to use a measuring device such as a spectrophotometer CM series (made by Konika Minolta), a color difference meter CR series (made by Konika Minolta), etc. Such measuring instruments having a xenon lamp light source and a light receiving element of a silicon photodiode capable of performing spectral dispersion using plane diffraction grating and outputting in the form of the Munsell color system can simply be used.

Operation of Light Emitting Device 100

When the light emitting device 100 is driven, power is supplied to the light emitting element 10 from an external light source via the electrodes 15, and thus the light emitting element 10 emits light. A portion of the light emitted by the light emitting element 10 is reflected by the reflecting member 30, and then is extracted to the outside having passed through the wavelength conversion member 20 as well as the covering member 40. In this manner, presence of the reflecting member 30 being provided can increase the contrast (i.e., difference in brightness) between the light emitting region and the non-light emitting region on the top surface of the light emitting device 100.

A preferred embodiment of the light emitting device 100 is described below.

As shown in FIG. 1B, the thickness of the covering member 40 is preferably smaller than the thickness of the wavelength conversion member 20. This can mitigate light loss within the covering member 40 and a decrease in light extraction efficiency by the covering of the covering member 40. Also, this can mitigate propagation of the light in the lateral direction within the covering member 40, and mitigate expansion of the light emitting region. The lower limit value of the thickness of the covering member 40 can be selected as appropriate, but from the perspective of giving a body color of the same or a similar color to the wavelength conversion member 20, the thickness of the covering member 40 is preferably 10 μm or greater, and more preferably 15 μm or greater. Also, the upper limit value of the thickness of the covering member 40 can be selected as appropriate, but from the perspective of light extraction efficiency, the thickness of the covering member 40 is preferably 100 μm or less, and more preferably 60 μm or less. The "thickness" here means the dimension in the up and down direction.

As shown in FIG. 1B, the covering member 40 is preferably in contact with the top surface 20a of the wavelength conversion member and the top surface 30a of the reflecting member. This can mitigate light loss due to a member interposed between the wavelength conversion member 20 and the covering member 40, and thus mitigate a decrease in light extraction efficiency. Also, this can mitigate propagation of light in the lateral direction within the member interposed between the wavelength conversion member 20 and the covering member 40, and thus can mitigate expansion of the light emitting region.

As shown in FIG. 1B, the top surface 40a of the covering member is preferably an uneven or non-planar surface having recesses and projections. This can promote light extraction from the top surface 40a of the covering member, and thus mitigate a decrease in the light extraction efficiency by the covering of the covering member 40. Also, this can mitigate propagation of light inside the covering member 40, and thus mitigate expansion of the light emitting region. Furthermore, it is possible to make the contact area smaller in the top surface 40a of the covering member with a cover tape or a suction nozzle (i.e., collet), and thus the light emitting device 100 is less likely to stick to the cover tape and/or to cause release failure during mounting. The recesses and projections of the top surface 40a of the covering member can be selected as appropriate, but the arithmetic mean roughness Ra is preferably 5 μm or more and 30 μm or less, and more preferably 10 μm or more and 20 μm or less. This arithmetic mean roughness Ra is in accordance with JIS B0601. Also, the recess and projections of the top surface 40a of the covering member are irregular recesses and projections with this embodiment 1, but it is also possible to use regular recesses and projections such as in embodiment 2 described later (see FIG. 4B).

The refractive index of the base material of the covering member 40 is preferably smaller than the refractive index of the base material of the wavelength conversion member 20. This can promote light transmission from the wavelength conversion member 20 to the covering member 40 and/or light transmission from the covering member 40 to outside the device, and can mitigate a decrease in light extraction efficiency by the covering of the covering member 40. Also, this can mitigate the propagation of light in the lateral direction within the covering member 40, and thus can mitigate expansion of the light emitting region. In specific terms, the refractive index of the base material of the covering member 40 is preferably at least 0.05 smaller than the refractive index of the base material of the wavelength conversion member 20, and is more preferably at least 0.1 smaller than the refractive index of the base material of the wavelength conversion member 20. The refractive index of the base material of the covering member 40 is preferably in a range of from 1.35 to 1.65, and more preferably in a range of from 1.35 to 1.55, for example. The refractive index is measured by the wavelength of the sodium D line at normal temperature (25° C.).

Method of Manufacturing the Light Emitting Device 100

Figure 3A:
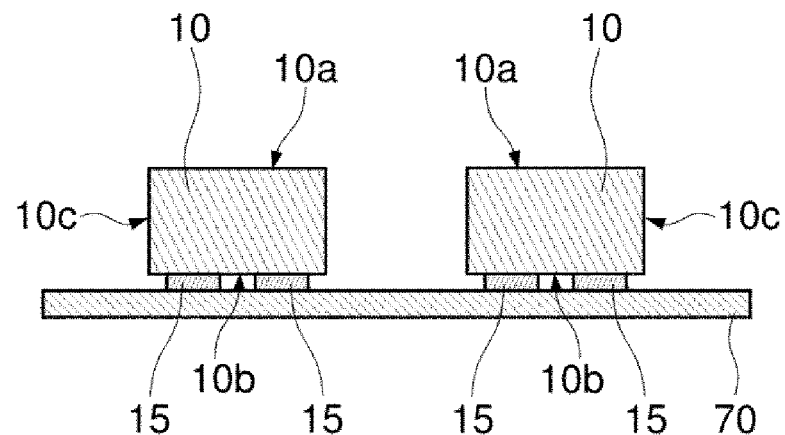
FIG. 3A is a schematic cross section view showing one stage of one step in a manufacturing method of the light emitting device of the embodiment of the present disclosure.
Figure 3B:
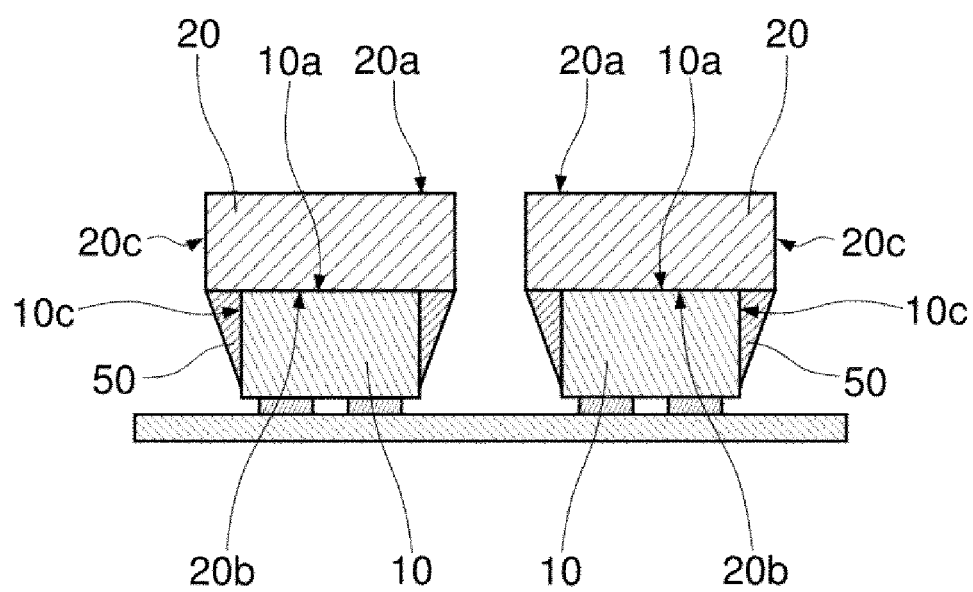
FIG. 3B is a schematic cross section view showing one stage of one step in a manufacturing method of the light emitting device of the embodiment of the present disclosure.
Figure 3C:
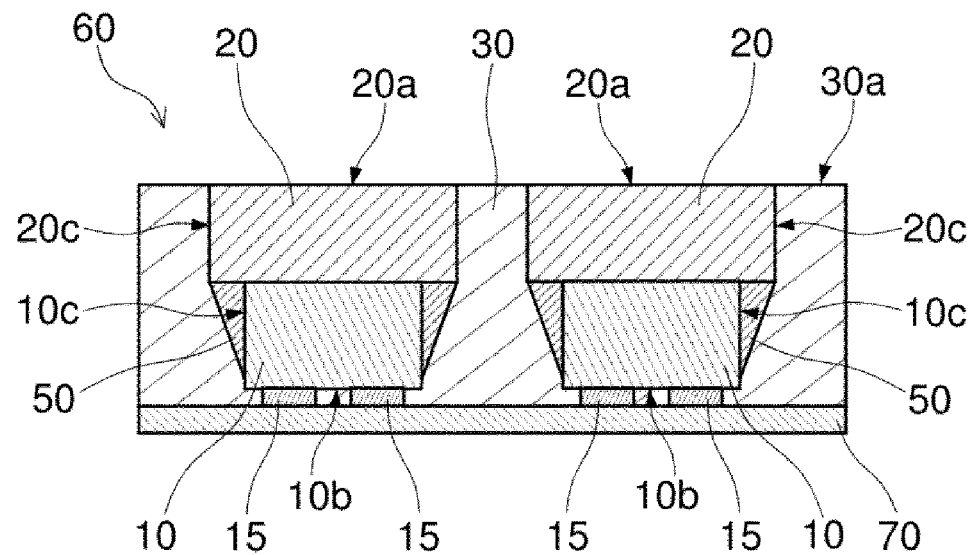
FIG. 3C is a schematic cross section view showing one stage of one step in a manufacturing method of the light emitting device of the embodiment of the present disclosure.
Figure 3D:
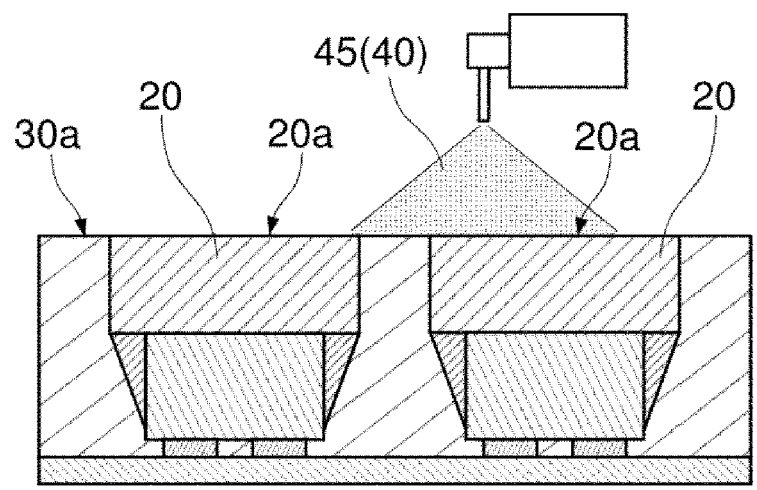
FIG. 3D is a schematic cross section view showing one step in a manufacturing method of the light emitting device of the embodiment of the present disclosure.
Figure 3E:
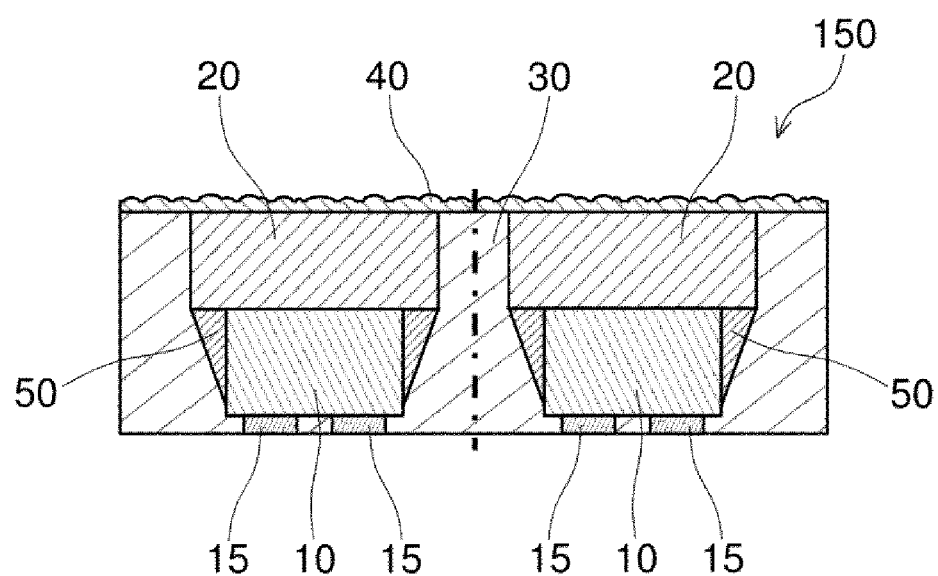
FIG. 3E is a schematic cross section view showing one step in a manufacturing method of the light emitting device of the embodiment of the present disclosure.

FIGS. 3A, 3B, and 3C are schematic cross section views respectively showing a first stage, a second stage, and a third stage of a first step of a method of manufacturing the light emitting device 100 of embodiment 1. FIGS. 3D and 3E are schematic cross section views respectively showing a second step and a third step of the method of manufacturing the light emitting device 100 of embodiment 1. With this embodiment 1, an example is described in which a collective body 150 of the light emitting device is produced by the first and second steps, and a third step is provided for which the collective body 150 of the light emitting devices is cut into individual light emitting devices 100. When the plurality of light emitting devices 100 are produced densely in this way, each step is performed in a manner of good work efficiency, and thus the light emitting devices 100 are manufactured with even better productivity.

The manufacturing method of the light emitting device 100 of embodiment 1 includes: a step (first step) of providing a light emitting structure having the light emitting element 10 which has the top surface and the lateral surfaces, the wavelength conversion member 20 which has the top surface, the bottom surface, and the lateral surfaces, provided facing the top surface of the light emitting element, and the reflecting member which has the top surface and is disposed on the lateral surface sides of the light emitting element and covers the lateral surfaces of the wavelength conversion member; and a step (second step) of supplying a covering member 40 to cover the top surface of the wavelength conversion member and the top surface of the reflecting member, the covering member 40 containing at least one of a pigment and a dye so that the body color of the covering member 40 is the same or a similar color to the body color of the wavelength conversion member.

The manufacturing method of the light emitting device 100 having such configuration can obtain a light emitting device for which the contrast (i.e., difference in brightness) between the light emitting region and the non-light emitting region is large, and the entire top surface of the light emitting device during non-light emission is the same or similar color of the wavelength conversion member 20.

First Step

As shown in FIG. 3A to 3C, the first step is a step for providing a light emitting structure 60. The light emitting structure 60 includes the light emitting element 10, the wavelength conversion member 20, and the reflecting member 30. The light emitting element 10 has the top surface 10a and the lateral surfaces 10c. The wavelength conversion member 20 has the top surface 20a, the bottom surface 20b, and the lateral surfaces 20c. The wavelength conversion member 20 has the bottom surface 20b provided facing the top surface 10a of the light emitting element. The reflecting member has the top surface 30a. The reflecting member 30 covers the lateral surfaces 10c of the light emitting element, and the lateral surfaces 20c of the wavelength conversion member. Such light emitting structure 60 can be provided using first to third stages like those described below, for example.

First Stage

As shown in FIG. 3A, the first stage is a stage in which the light emitting element is placed on a support 70. First, the light emitting element 10 having the top surface the bottom surface 10b, and the lateral surfaces 10c is provided, and a pair of positive and negative electrodes 15 is connected to the bottom surface 10b of the light emitting element 10. Then, the bottom surface 10b of the light emitting element 10 is placed facing the top surface of the support 70. The support 70 is a sheet, etc., having a sticky top surface, for example. In that case, it is possible to adhere the electrodes 15 to the top surface of the sheet and temporarily fix the light emitting element 10. In addition, the support 70 can also be a substrate provided with conductor wiring. In that case, the electrodes 15 may be adhered to the conductor wiring using an electrically conductive adhesive agent to fix the light emitting element 10.

Second Stage

As shown in FIG. 3B, the second stage is a stage for placing the wavelength conversion member 20 on the light emitting element 10. In specific terms, first, the wavelength conversion member 20 having the top surface 20a, the bottom surface 20b, and the lateral surfaces 20c is provided. The wavelength conversion member 20 can be produced by singulating a sheet form wavelength conversion member to a designated size, for example. As a singulating method, there is cutting using a rotary blade, cutting by applying ultrasonic waves to a non-rotating blade, etc. Next, the singulated wavelength conversion member 20 is placed on the light emitting element 10 with an adhesive member to-be the light guide member 50 interposed. At this time, from the perspective of light distribution, etc., it is preferable to adhere so that the center of the bottom surface 20b of the wavelength conversion member coincides with the center of the top surface 10a of the light emitting element when viewed form the top. In this step, by adjusting the amount of the adhesive member, the adhesive member can be allowed to slide down to the lateral surfaces 10c of the light emitting element, and to form the light guide member 50 on the lateral surfaces 10c of the light emitting element. It is also possible to place the adhesive member to-be the light guide member 50 between the top surface 10a of the light emitting element and the bottom surface 20b of the wavelength conversion member at a designated thickness. Though not illustrated, the adhesive member is interposed in a very thin state between the top surface 10a of the light emitting element and the bottom surface 20b of the wavelength conversion member in order to adhere the light emitting element 10 and the wavelength conversion member 20.

Third Stage

As shown in FIG. 3C, the third stage is a stage for covering the lateral surfaces 10c of the light emitting element and the lateral surfaces 20c of the wavelength conversion member with the reflecting member 30. In specific terms, for example, this can be performed using a discharge device (e.g., dispenser) which is positioned above the support 70 and movable in the up and down direction or the lateral direction with respect to the support 70 to apply a material such as resin to-be the reflecting member 30 on the support 70. At this time, the amount of the reflecting member 30 is adjusted so as to have the lateral surfaces 20c of the wavelength conversion member covered, and the top surface 20a exposed. In more specific terms, the top surface 30a of the reflecting member and the top surface 20a of the wavelength conversion member are flush with each other, or the top surface 30a of the reflecting member is made to be positioned at a lower level than the top surface 20a of the wavelength conversion member. In addition to this, the reflecting member 30 can be supplied using a compression molding method, a transfer molding method, etc. Also, after supplying the reflecting member 30 to cover to above the wavelength conversion member 20, the top surface 20a of the wavelength conversion member can be exposed by removing a portion of the reflecting member 30 by grinding, polishing, blasting, etc. In this embodiment, the light guide member 50 is formed at least on a portion of the lateral surfaces 10c of the light emitting element, so at least a portion of the lateral surfaces 10c of the light emitting element is covered with the reflecting member 30 with the light guide member 50 interposed. The light extraction efficiency can be increased by supplying the reflecting member 30 between the bottom surface 10b of the light emitting element and the support 70, and by covering the bottom surface 10b of the light emitting element and the lateral surfaces of the electrodes 15 with the reflecting member 30.

Second Step

As shown in FIG. 3D, the second step is a step for covering the top surface 20a of the wavelength conversion member and the top surface 30a of the reflecting member using the covering member 40 that contains at least one of a pigment and a dye, and for which the body color is the same or a similar color to the body color of the wavelength conversion member 20. In specific terms, at least one of a pigment and a dye for which the type and amount are adjusted so that the body color thereof is the same or a similar color to the body color of the wavelength conversion member 20 is mixed with a base material of resin, etc., this is applied on the top surface 20a of the wavelength conversion member and the top surface 30a of the reflecting member, and the covering member 40 is produced. Placing the covering member 40 using a spray method in particular is preferable because it is easy. Also, with the spray method, it is relatively easy to form recesses and projections on the top surface of the covering member 40. In specific terms, after spraying a liquid material 45 of the covering member on the top surface 20a of the wavelength conversion member and the top surface 30a of the reflecting member, by hardening or solidifying, this is adhered as a covering film. Aside from this, formation of the covering member 40 can be performed by potting, printing, etc.

Third Step

As shown in FIG. 3E, the third step is a step of cutting the collective body 150 of the light emitting device on the cutting lines, specifically, singulating the collective body 150 of the light emitting device. In specific terms, a cutting line is set at the center between the light emitting devices, and the collective body 150 of the light emitting device is cut in the vertical direction at the site of this cutting line. Cutting can be performed using a conventionally known method such as a singulating method of cutting with a blade, a breaking method of breaking after scribing, etc. Also, by singulating the collective body 150 of this light emitting device, a plurality of light emitting devices 100 each comprising the light emitting element 10, the pair of positive and negative electrodes 15, the wavelength conversion member 20, the reflecting member 30, the covering member 40, and the light guide member 50 is obtained.

Embodiment 2

Light Emitting Device 200

Figure 4A:
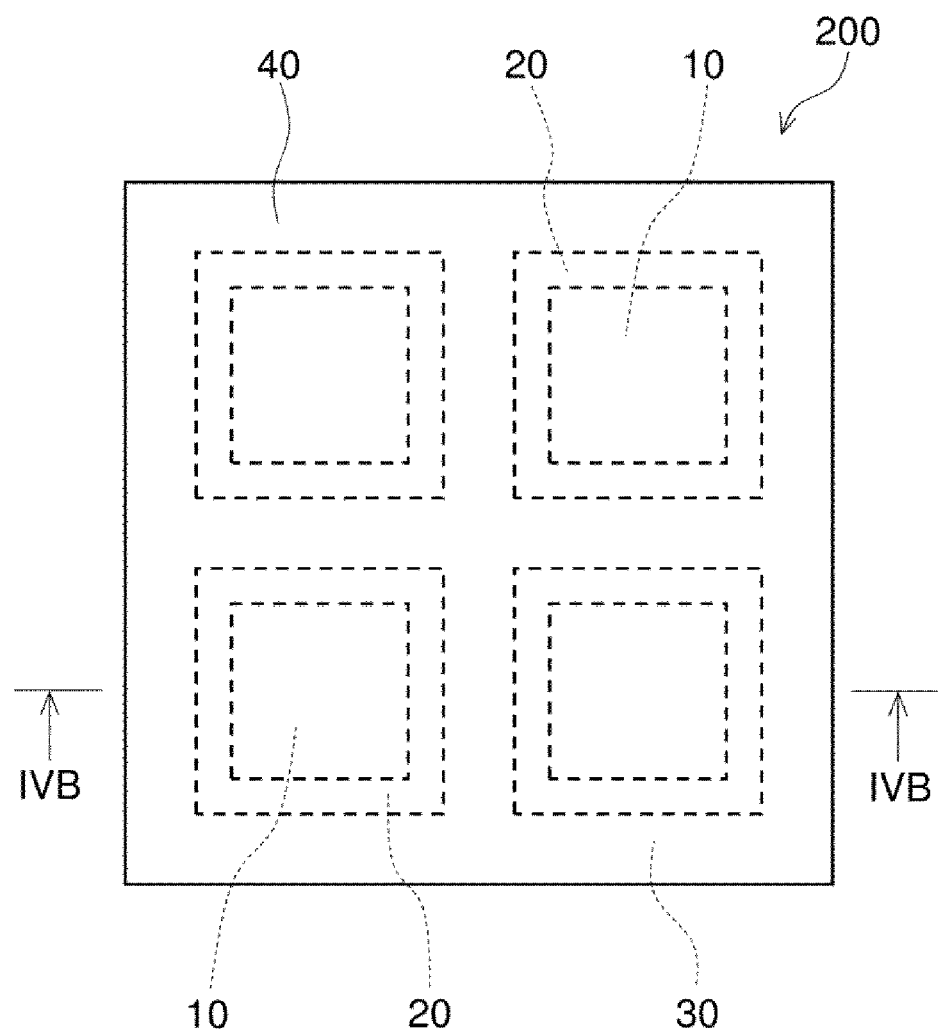
FIG. 4A is a schematic top view of the light emitting device of another embodiment of the present disclosure.
Figure 4B:
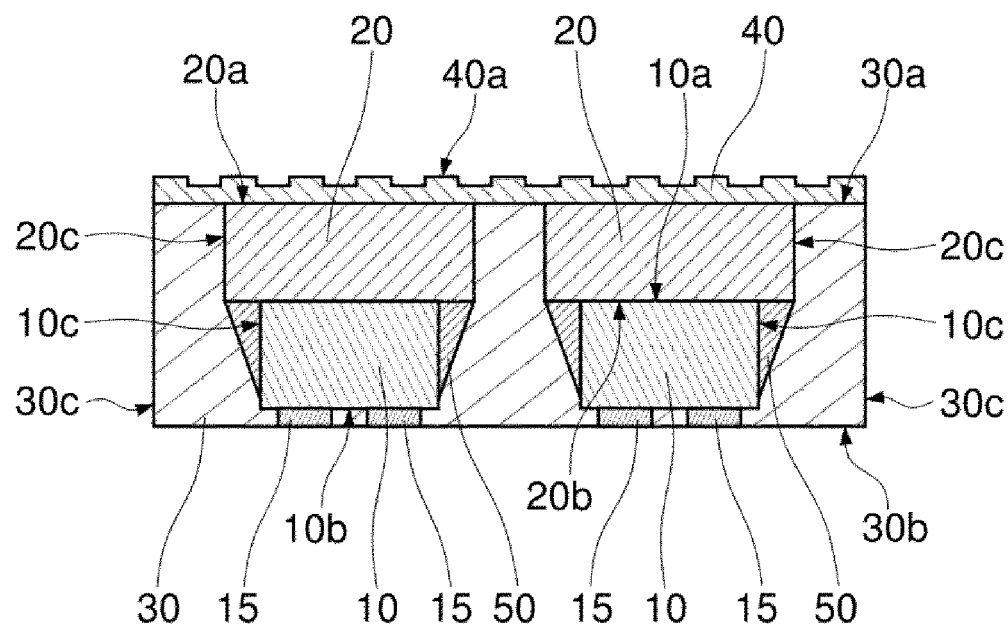
FIG. 4B is a schematic cross section view of line IVB-IVB of the light emitting device shown in FIG. 4A.

FIG. 4A is a schematic top view of a light emitting device 200 of embodiment 2. FIG. 4B is a schematic cross section view of line IVB-IVB of the light emitting device 200 shown in FIG. 4A. The light emitting device 200 of embodiment 2 differs from the light emitting device 100 of embodiment 1 in regards to the point that it comprises respectively a plurality of the light emitting element 10 and the electrodes 15 connected thereto, the wavelength conversion member 20, and the light guide member 50 (four in this embodiment), and the other points are essentially the same as the light emitting device 100 of embodiment 1.

As shown in FIGS. 4A and 4B, the light emitting device 200 of embodiment 2 comprises a plurality of the light emitting elements 10, a plurality of the wavelength conversion members 20, one reflecting member 30, and one covering member 40. Also, the light emitting device 200 of embodiment 2 further comprises the electrodes 15 and the light guide member 50. Each of the light emitting elements 10 has the top surface 10a, the bottom surface 10b, and the lateral surfaces 10c. The electrodes 15 connected to one light emitting element 10 are a positive and negative pair, and are respectively connected to the bottom surface 10b of each light emitting element. Each of the wavelength conversion members 20 has the top surface 20a, the bottom surface 20b, and the lateral surfaces 20c. Each of the wavelength conversion members 20 has the bottom surface 20b provided facing the top surface 10a of each light emitting element. The reflecting member 30 has the top surface 30a the bottom surface 30b, and the lateral surfaces 30c. The reflecting member 30 covers the bottom surface 10b and the lateral surfaces 10c of each light emitting element, and the lateral surfaces 20c of each wavelength conversion member. In more detail, the reflecting member 30 covers the lateral surfaces 10c of each light emitting element with the light guide member 50 interposed. The bottom surface and the lateral surfaces 30c of the reflecting member configure the outer surface of the light emitting device 200. The bottom surface 30b of the reflecting member configures the same surface as the bottom surface of each electrode 15. The covering member 40 covers the top surface 20a of each wavelength conversion member and the top surface 30a of the reflecting member. The covering member 40 contains at least one of a pigment and a dye. The body color of each wavelength conversion member 20 and the body color of the covering member 40 are of the same or a similar color.

The light emitting device 200 having this kind of configuration also can have the contrast (difference in brightness) between the light emitting region and the non-light emitting region during light emission be large, and can have the entire top surface of the light emitting device during non-light emission be the same or similar color of the wavelength conversion member 20. Also, using the covering member 40, it is possible to protect the wavelength conversion substance in each wavelength conversion member 20 from the outside environment.

The top surface view shape of the reflecting member 30 with the light emitting device 100 of embodiment 1 is a single frame shape, but in the case of the light emitting device 200 of embodiment 2 that comprises a plurality of wavelength conversion members 20, for example, as shown in FIG. 4A, the top surface view shape of the reflecting member 30 is a grid shape. For this reason, the positioning of the color of the wavelength conversion member 20 and the color of the reflecting member 30 on the top surface of the light emitting device 200 is more complex, and the external visual of a lens is likely to worsen due to appearance of the color of both members. Therefore, the configuration of the covering member 40 of this embodiment more easily exhibits the effect.

Method of Manufacturing Light Emitting Device 200

FIGS. 5A, 5B, 5C, 5D, 5E, and 5F are schematic cross section views respectively showing a first step, second step, third step, fourth step, fifth step, and sixth step of the method of manufacturing the light emitting device 200 of embodiment 2.

The manufacturing method of the light emitting device 200 of embodiment 2 includes: a step (first step) for providing a light emitting element having a first surface, a second surface on the opposite side to the first surface, and lateral surfaces between the first surface and the second surface; a step (second step) for providing a wavelength conversion member having a first surface, a second surface on the opposite side to the first surface, and a lateral surfaces between the first surface and the second surface; a step (third step) for providing a covering member having a first surface, and a second surface on the opposite side to the first surface, containing at least one a pigment and a dye so that the body color of the covering member is the same or a similar color to the body color of the wavelength conversion member; a step (fourth step) for placing the wavelength conversion member with the first surface of the wavelength conversion member facing the second surface of the covering member; a step (fifth step) for placing the light emitting element with the first surface of the light emitting element facing the second surface of the wavelength conversion member; and a step (sixth step) for supplying the reflecting member to cover the second surface of the covering member, and disposed on the lateral surface sides of the wavelength conversion member and the lateral surface sides of the light emitting element.

The manufacturing method of the light emitting device 200 having such configuration can also obtain the light emitting device for which the contrast (difference in brightness) of the light emitting region and the non-light emitting region is large, and for which the entire top surface of the light emitting device during non-light emission is the same or similar color of the wavelength conversion member.

First Step

Figure 5A:
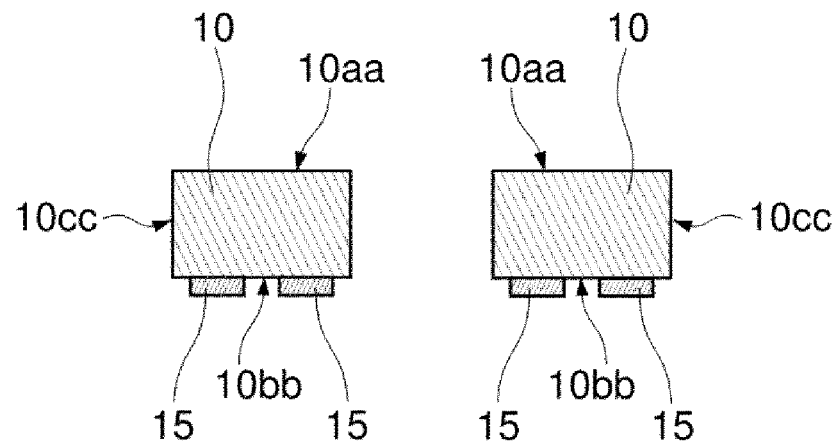
FIG. 5A is a schematic cross section view showing one step in a manufacturing method of the light emitting device of the other embodiment of the present disclosure.

As shown in FIG. 5A, the first step is a step for providing the light emitting element 10 having a first surface 10aa, a second surface 10bb on the opposite side to the first surface 10aa, and lateral surfaces 10cc between the first surface 10aa and the second surface 10bb. In the present embodiment, the plurality of light emitting elements 10 is provided. The pair of positive and negative electrodes 15 is connected to the second surface 10bb of each light emitting element 10.

Second Step

Figure 5B:
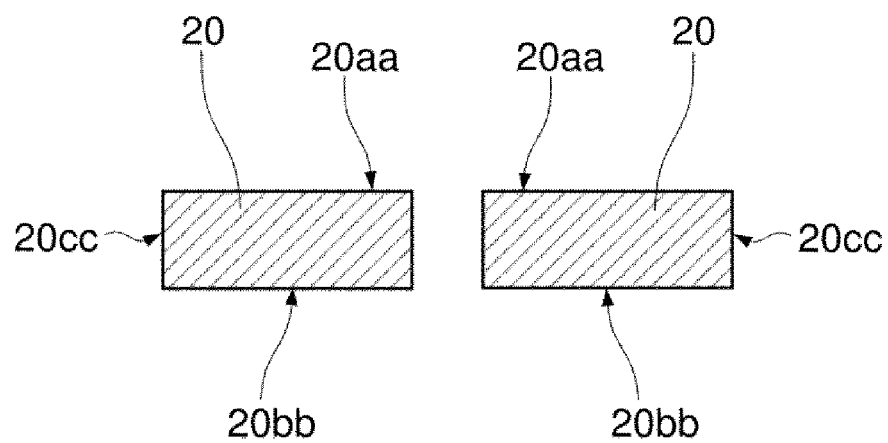
FIG. 5B is a schematic cross section view showing one step in a manufacturing method of the light emitting device of the other embodiment of the present disclosure.

As shown in FIG. 5B, the second step is a step for providing the wavelength conversion member 20 having a first surface 20aa, a second surface 20bb on the opposite side to the first surface 20aa, and lateral surfaces 20cc between the first surface 20aa and the second surface 20bb. In the present embodiment, a plurality of the wavelength conversion members 20 is provided. The wavelength conversion member 20 can be produced by singulating a sheet shaped wavelength conversion member to a designated size, for example. As the method of singulating, there are cutting using a rotary blade, cutting by applying ultrasonic waves with a non-rotating blade, etc.

Third Step

Figure 5C:
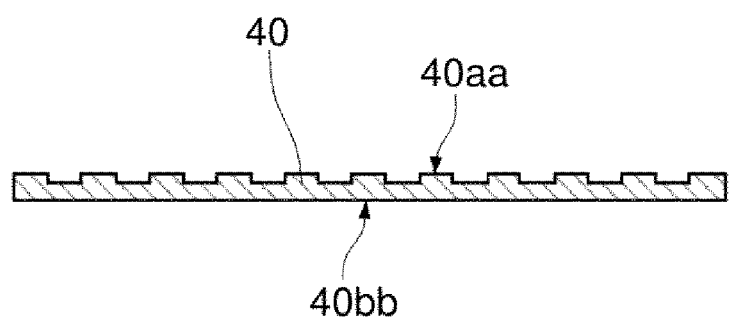
FIG. 5C is a schematic cross section view showing one step in a manufacturing method of the light emitting device of the other embodiment of the present disclosure.

As shown in FIG. 5C, the third step is a step for providing the covering member having a first surface 40aa, and a second surface 40bb on the opposite side to the first surface 40aa, containing at least one of a pigment and a dye, and for which the body color is the same or a similar color to the body color of the wavelength conversion member 20. In specific terms, the covering member 40 is produced by mixing and molding a base material formed of, for example, resin and at least one of a pigment or a dye for which the type and amount are adjusted so that the body color is the same or a similar color to the body color of the wavelength conversion member 20. In the present embodiment, the covering member 40 is formed to a sheet shape by coating, printing, a compression molding method, a transfer molding method, etc. It is also possible to do singulating of the covering member formed in a sheet shape to a designated size. As the method of singulating, there are cutting using a rotary blade, cutting by applying ultrasonic waves with a non-rotating blade, etc. Also, if a molding method using a metal mold is used, it is possible to easily provide recesses and projections of desired shape on the first surface of the covering member.

Fourth Step

Figure 5D:
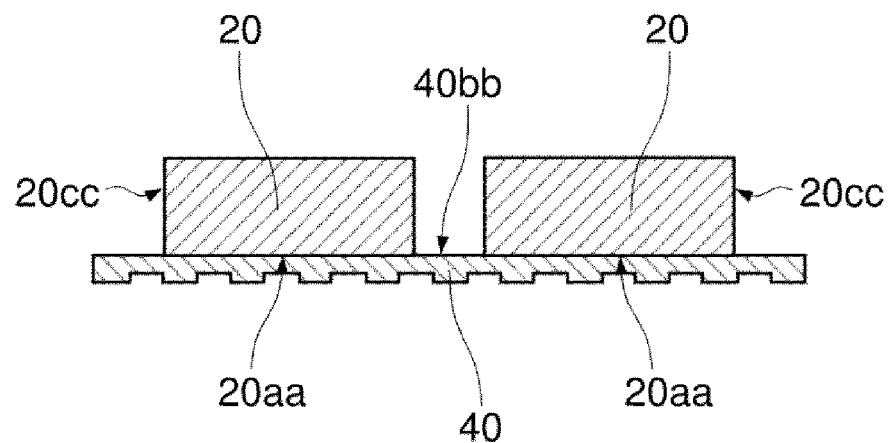
FIG. 5D is a schematic cross section view showing one step in a manufacturing method of the light emitting device of the other embodiment of the present disclosure.

As shown in FIG. 5D, the fourth step is a step of placing the first surface 20aa of the wavelength conversion member facing the second surface 40bb of the covering member. In specific terms, the plurality of singulated wavelength conversion members 20 are separated at equal intervals, and are respectively placed on the covering member 40 with an adhesive member interposed. Though not illustrated, in the present embodiment, the adhesive member is interposed in a very thin state between the first surface 20aa of the wavelength conversion member and the second surface 40bb of the covering member. Also, to reduce expansion of the light emitting region, it is preferable to mitigate creeping up or sliding down of the adhesive member to the lateral surfaces 20cc of the wavelength conversion member, and more preferable to have no creeping up or sliding down of the adhesive member to the lateral surfaces 20cc of the wavelength conversion member.

Fifth Step

Figure 5E:
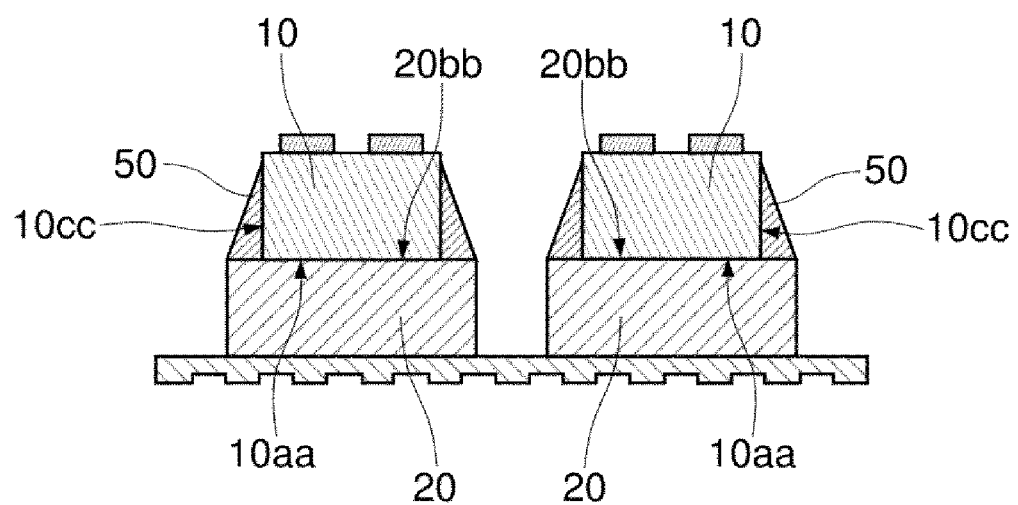
FIG. 5E is a schematic cross section view showing one step in a manufacturing method of the light emitting device of the other embodiment of the present disclosure.

As shown in FIG. 5E, step 5 is a step for placing the first surface 10aa of the light emitting element facing the second surface 20bb of the wavelength conversion member. In specific terms, the plurality of light emitting elements 10 are respectively placed on each wavelength conversion member 20 with an adhesive member to-be the light guide member 50 interposed. At this time, from the perspective of light distribution, etc., it is preferable to perform the adhesion so that the center of the first surface 10aa of the light emitting element coincides with the center of the second surface 20bb of the wavelength conversion member. In the present embodiment, by adjusting the amount of the adhesive member, the adhesive member creeps up or slides down the lateral surfaces 10cc of the light emitting element, and thus the light guide member 50 is formed on the lateral surfaces 10cc of the light emitting element. Also, as explained with embodiment 1, the adhesive member to-be the light guide member 50 is preferably placed at a designated thickness between the first surface 10aa of the light emitting element and the second surface 20bb of the wavelength conversion member. Though not illustrated, in the present embodiment, the adhesive member is interposed in a very thin state to adhere the light emitting element 10 and the wavelength conversion member 20 between the first surface 10aa of the light emitting element and the second surface 20bb of the wavelength conversion member.

Sixth Step

Figure 5F:
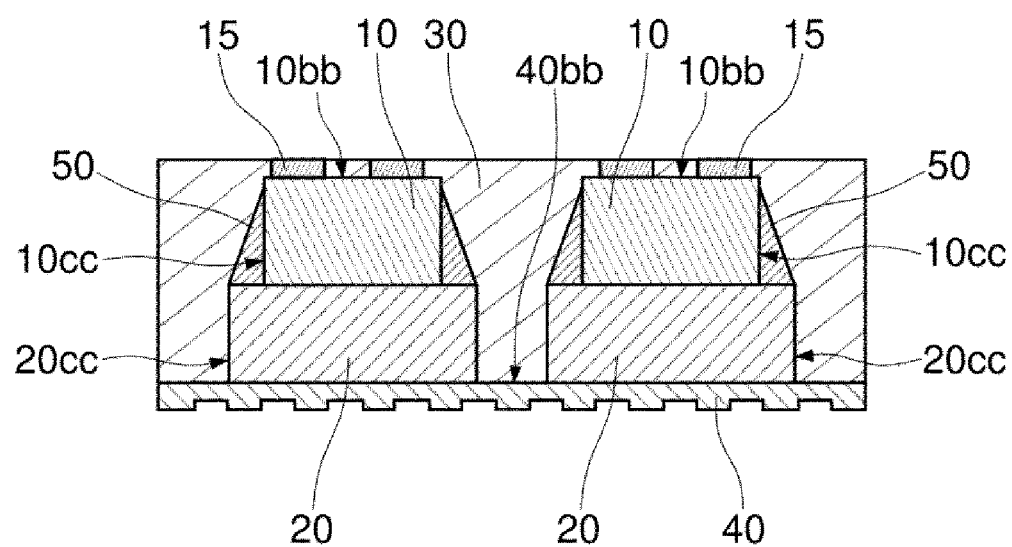
FIG. 5F is a schematic cross section view showing one step in a manufacturing method of the light emitting device of the other embodiment of the present disclosure.

As shown in FIG. 5F, the sixth step is a step for supplying the reflecting member to cover the second surface 40bb of the covering member, the lateral surfaces 20cc of the wavelength conversion member, and the lateral surfaces 10cc of the light emitting element. In specific terms, for example, this can be performed using a discharge device (e.g., dispenser) which is positioned above the second surface 40bb side of the covering member 40 and can be moved (movable) in the up and down direction or the lateral direction with respect to the covering member 40 to supply resin, etc. to-be the reflecting member 30 on the covering member 40. At this time, the amount of the reflecting member 30 is adjusted so as to have the lateral surfaces 10cc of each light emitting element covered, and the electrodes 15 exposed. In addition to this, the reflecting member can be supplied using a compression molding method, a transfer molding method, etc. Also, the electrodes 15 can be exposed by, after covering all of each light emitting element 10 including the electrodes 15 using the reflecting member 30, removing a portion of the reflecting member 30 by grinding, polishing, blasting, etc. In this embodiment, the light guide member 50 is formed at least on a portion of the lateral surfaces 10cc of the light emitting element, so at least a portion of the lateral surfaces of the light emitting element is covered with the reflecting member 30 with the light guide member 50 interposed. It is also possible to increase the light extraction efficiency by covering the second surface 10bb of the light emitting element and the lateral surfaces of the electrodes 15 with the reflecting member 30.

Each constitutional element of the light emitting device of an embodiment of the present disclosure is explained as follow.

Light Emitting Element 10

The light emitting element is preferably a semiconductor light emitting element. The light emitting element includes: semiconductor element structure; and positive (p-side) and negative (n-side) electrodes which are connected to the semiconductor element structure. As the semiconductor light emitting element, an example includes an LED (i.e., light emitting diode) chip. In particular, the light emitting element is preferably a nitride semiconductor element that can efficiently emit short-wavelength light capable of easy exciting the wavelength conversion substance. The nitride semiconductor is mainly represented by general formula $In_xAl_yGa_{1-x-y}N$ ($0 \leq x$, $0 \leq y$, $x+y \leq 1$). In addition, the light emitting element may also be an element of a zinc sulfide semiconductor, a zinc selenide semiconductor, a silicon carbide semiconductor, etc. The light emission peak wavelength of the light emitting element is preferably in the blue range, and more preferably in the range of 450 nm or more and 475 nm or less from the perspective of light emitting efficiency, as well as the mixed color relationship between excitation of the wavelength conversion substance and the light emission thereof. The top surface view shape of the light emitting element is preferably a rectangular shape, and particularly a square or a rectangular shape that is longer in one direction. The thickness of the light emitting element can be selected as appropriate, but from the perspective of light extraction efficiency, mechanical strength, etc., it is preferably in the range of 50 μm or more and 500 μm or less, and more preferably in the range of 80 μm or more and 300 μm or less. The number of light emitting elements mounted in one light emitting device can be one or a plurality. The plurality of light emitting elements can be connected in series or in parallel.

Electrodes 15

The electrodes are provided electrically connected to a semiconductor element structure of the light emitting element. Specifically, the pair of electrodes are respectively connected to a p-side electrode and an negative electrode of the light emitting element, and serve as external electrodes. The electrodes are configured at least as a positive (p-side) and negative (n-side) pair. The electrodes can be configured by small pieces of metal or alloy. In specific terms, the electrodes can be configured from at least one of gold, silver, copper, iron, tin, platinum, zinc, rhodium, titanium, nickel, palladium, aluminum, tungsten, chromium, molybdenum, and alloys of these. Among such examples, copper has good heat conductivity, and is relatively inexpensive, so copper or a copper alloy are particularly preferable. Also, gold or a gold alloy is also preferable, because it has a good bondability due to the property of chemically stable and less likely to undergo surface oxidation. From the perspective of solder bondability, the electrodes preferably have a covering of gold or silver on the surface.

Wavelength Conversion Member 20

The wavelength conversion member contains a transparent base material and a wavelength conversion substance in that base material. The wavelength conversion member may be configured with a single layer in the thickness direction, or may also be configured with multilayer When the wavelength conversion member is configured by multilayer, it is possible to use different types of base material for each layer, or a different type of wavelength conversion substance may be contained in each layer. The diameter of the wavelength conversion member can be in the range of 200 µm or more and 1200 µm or less, for example. When the diameter of the wavelength conversion member is greater than the diameter of the light emitting element, the light extraction efficiency can be increased. When the diameter of the wavelength conversion member is smaller than the diameter of the light emitting element, the light emitting region can be smaller, the brightness can be increased. Also, for the shape of the wavelength conversion member in the top view, examples include a rectangular, a hexagonal, or a circular shape. Also, for the shape of the wavelength conversion member, from the perspective of light distribution, etc., a mathematically similar shape to the light emitting element is preferable. The thickness of the wavelength conversion member can be selected as appropriate, but from the perspective of light extraction efficiency, the content amount of the wavelength conversion substance, etc., it is preferably in the range of 50 µm or more and 300 µm or less, and more preferably in the range of 70 µm or more and 200 µm or less.

Base Material of Wavelength Conversion Member

For the base material of the wavelength conversion member, it is possible to use at least one material selected from the group consisting of silicone resin, epoxy resin, phenol resin, acrylic resin, polycarbonate resin, TPX resin, polynorbornene resin, urethane resin, and modified resins thereof, as well as glass and ceramic. Among such examples, silicone resin or a modified silicone resin is preferable in terms of having good resistance to heat and light. In specific examples of the silicone resin include dimethyl silicone resin, phenyl methyl silicone resin, and diphenyl silicone resin. In particular, including a phenyl group can make the refractive index higher, and enhance the heat resistance and gas barrier property. The "modified resin" in this specification encompasses hybrid resins.

Wavelength Conversion Substance

The wavelength conversion substance absorbs at least a portion of light (i.e., primary light) emitted from the light emitting element, and emits light (i.e., secondary light) of a different wavelength from the primary light. This can obtain a light emitting device that emits mixed light of a visible wavelength primary light and secondary light, such as white light, etc., for example. The content amount of the wavelength conversion substance in the wavelength conversion member can be selected as appropriate according to the desired light emission chromaticity, but, for example, the content amount is preferably in the range of 40 parts by weight to 250 parts by weight, and more preferably in the range of 70 parts by weight to 150 parts by weight. "Parts by weight" represents weight (g) of a subject particle blended with respect to weight 100 g of the base material. In specific terms, as the wavelength conversion substance, examples include cerium activated yttrium aluminum garnet, cerium activated lutetium aluminum garnet, cerium activated terbium aluminum garnet, nitrogen-containing calcium aluminosilicate activated with one or two of europium and chromium, sialon activated with europium, silicate activated with europium, potassium fluorosilicate activated with manganese, etc. The wavelength conversion substance can be one of the specific examples noted above alone, or a combination of two or more can be used. For example, the wavelength conversion substance can emit light with good color reproducibility or good color rendering property by being configured by a phosphor that emits green light to yellow light, and a phosphor that emits red light.

In the present specification, the color of the phosphor itself can be any color as long as the body color of the wavelength conversion member and the body color of the covering member are of the same or a similar color. The "body color" means the color of the member itself during non-light emission of the light emitting device. When using the light emitting device as a light source of a lighting device such as the flash light of a camera, etc., the body color of the phosphor used for the wavelength conversion member is preferably yellow or orange. Examples of the yellow phosphor include yttrium aluminum garnet based phosphor (i.e., YAG based phosphor), lutetium aluminum garnet based phosphor (i.e., LAG based phosphor), terbium aluminum garnet based phosphor (i.e., TAG based phosphor), etc. Examples of the red based phosphor include SCASN, CASN, etc. It is also possible to mix the yellow phosphor and the red phosphor to make an orange phosphor. As the color for when the color of the phosphor itself is a yellow color and an orange color, for example, in the Munsell color wheel of the Munsell color system (20 hues) described hereafter, examples include the 5YR, 10YR, 5Y, and 10Y hues. As the color of the phosphor itself, in the case of a yellow phosphor, this is preferably 10Y or 5Y, and more preferably 5Y. In the case of an orange phosphor, this is preferably 10YR or 5YR, and more preferably 5YR. A phosphor having a yellow body color will be explained below using 5Y in the Munsell hue circle of the Munsell color system (20 hues) as an example. In the Munsell color system, the lightness is preferably 7 or greater, and more preferably 8 or greater. Also, the lightness is preferably 9 or less, and more preferably 8 or less. Also, in the Munsell color system, the chroma is preferably 4 or greater, and more preferably 6 or greater. Also, the chroma is preferably 14 or less.

Reflecting Member 30

The reflecting member is a member for reflecting the light emitted by the light emitting element and travelling laterally or downwards towards the wavelength conversion member. From the perspective of making the contrast between the light emitting region and the non-light emitting region on the top surface of the light emitting device larger, it is preferable that the reflecting member cover half or more of the lateral surfaces of the wavelength conversion member, and more preferably the reflecting member cover approximately the entire lateral surfaces of the wavelength conversion member, in the height direction. Furthermore, it is preferable that the reflecting member covers the bottom surface and at least a portion of the lateral surfaces of the light emitting element. For example, the reflecting member may surround and cover via a light guide member at regions of the lateral faces of the light emitting element that are covered by the light guide member, while directly cover at regions of the lateral faces of the light emitting element where the light guide member exists. Also, from the perspective of light reflectivity, it is preferable that the reflecting member be white. The reflecting member contains a reflective material in the base material or a binder (i.e., binding agent), for example.

Base Material/Binder of Reflecting Member

For the base material or the binder of the reflecting member, it is possible to use at least one material selected from the group consisting of silicone resin, epoxy resin, phenol resin, acrylic resin, polycarbonate resin, TPX resin, polynorbornene resin, urethane resin and modified resins thereof, as well as glass. Among such examples, silicone resin or a modified silicone resin is preferable in terms of having good resistance to heat and light. Specific examples of silicone resin include dimethyl silicone resin, phenylmethyl silicone resin, and diphenyl silicone resin. In particular, including a phenyl group can enhance the heat resistance and the gas barrier properties.

Reflective Material

For the reflective material, it is possible to use one type alone or a combination of two or more types of: titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. Among such examples, titanium oxide is preferable from the point of having good light reflectivity and being available relatively inexpensively. The content amount of the reflective material in the reflecting member can be selected as appropriate, but from the perspective of light reflectivity and viscosity in the liquid state, etc., it is preferably in the range of 20 parts by weight to 300 parts by weight, and more preferably in the range of 50 parts by weight to 200 parts by weight.

Covering Member 40

The covering member includes a translucent base material at least one of a pigment and a dye is contained in that base material.

Base Material of Covering Member

For the base material of the covering member, it is possible to use at least one material selected from the group consisting of epoxy resin, silicone resin, phenol resin, acrylic resin, polycarbonate resin, TPX resin, polynorbornene resin, urethane resin, and modified resins thereof, as well as glass, and ceramic. Among such examples, epoxy resin or a modified epoxy resin is preferable because it has good adhesiveness and gas barrier properties. Also, silicone resin or a modified silicone resin is preferable in terms of having good resistance to heat and light. Specific examples of silicone resin include dimethyl silicone resin, phenyl methyl silicone resin, and diphenyl silicone resin. In particular, including a phenyl group can enhance the heat resistance and gas barrier properties.

Pigment, Dye

The pigment can be selected as appropriate, and there are items that use inorganic materials or organic materials, with examples including items using the following materials. As inorganic materials, examples include colcothar ($Fe_2O_3$), red lead ($Pb_3O_4$), titanium nickel antimony oxide, titanium nickel barium oxide, titanium chromium antimony oxide, titanium chromium niobium oxide, etc. As organic materials, examples include anthraquinone type, azo type, quinacridone type, perylene type, diketopyrrolopyrrole type, monoazo type, disazo type, pyrazolone type, benzimidazolone type, quinoxaline type, azomethine type, isoinodrinone type, isoinodrin type, etc. The dye can be selected as appropriate, and examples include anthraquinone type dye, methine type dye, azomethine type dye, oxazine type dye, azo type dye, styryl type dye, coumarin type dye, porphyrin type dye, dibenzofuranone type dye, diketopyrrolopyrrole type dye, rhodamine type dye, xanthene type dye, pyrromethene type dye, etc. Pigments and dyes basically are preferably those that do not convert the light from the light emitting element into light having a different wavelength.

Light Guide Member 50

The light guide member is a light transmissive member, which facilitates light extraction from the light emitting element, and guiding of light from the light emitting element to the wavelength conversion member. The light guide member is formed by, for example, the adhesive member that adheres the light emitting element and the wavelength conversion member creeping up or sliding down the lateral surfaces of the light emitting element. The light guide member preferably covers at least a portion of the lateral surfaces of the light emitting element, and more preferably cover approximately the entire lateral surfaces of the light emitting element, from the perspective of increasing the light extraction efficiency. As shown in FIG. 1B, the light guide member is formed in a triangular shape in a cross-sectional view so that the width of the light guide member spreads from the lower face of the light emitting element towards the wavelength conversion member. With this configuration, the light extraction efficiency can be increased. In addition, the lateral surfaces of the light guide member may be curved surfaces projected toward the light emitting element, or curved surfaces projected toward the second reflecting member. Also, the light guide member can be placed between the light emitting element and the wavelength conversion member. In that case, from the perspective of firmly adhering the light emitting element and the wavelength conversion member, and the perspective of increasing the light extraction efficiency, the thickness of the light guide member is preferably in the range of 0.5 μm or more and 20 μm or less, and more preferably in the range of 0.5 μm or more and 10 μm or less. For the base material of the light guide member, it is possible to use at least one selected from the group consisting of silicone resin, epoxy resin, phenol resin, acrylic resin, polycarbonate resin, TPX resin, polynorbornene resin, urethane resin, and modified resins thereof, as well as glass. Among such examples, silicone resin or a modified silicone resin is preferable in terms of having good resistance to heat and light. Specific examples of silicone resin include dimethyl silicone resin, phenyl methyl silicone resin, and diphenyl silicone resin. In particular, including a phenyl group can enhance the heat resistance and gas barrier properties. The light guide member can be absent.

The light emitting device of an embodiment of the present disclosure can be used for various types of lighting device, such as a flash light of a camera, general lighting, etc.

What is claimed is:

1. A method of manufacturing a light emitting device comprising:
   providing a light emitting structure including
   a light emitting element having a top surface and lateral surfaces,
   a wavelength conversion member having a top surface, a bottom surface, and lateral surfaces, with the bottom surface of the wavelength conversion member facing the top surface of the light emitting element, and
   a reflecting member surrounding the lateral surfaces of the light emitting element and the lateral surfaces of the wavelength conversion member, the reflecting member having a top surface; and
   supplying a covering member to cover the top surface of the wavelength conversion member and the top surface of the reflecting member, the covering member containing at least one of a pigment and a dye so that a body color of the covering member is the same or a similar color as a body color of the wavelength conversion member, the covering member being configured not to convert a wavelength of light entered into the covering member.

2. The method of manufacturing a light emitting device according to claim 1, wherein
   the supplying of the covering member is performed by a spray method.

3. The method of manufacturing a light emitting device according to claim 1, wherein
   the supplying of the covering member includes supplying the covering member so that a thickness of the covering member is smaller than a thickness of the wavelength conversion member.

4. The method of manufacturing a light emitting device according to claim 1, wherein
   the supplying of the covering member includes supplying the covering member so that a refractive index of a base material of the covering member is smaller than a refractive index of a base material of the wavelength conversion member.

5. The method of manufacturing a light emitting device according to claim 1, wherein
   the supplying of the covering member includes supplying the covering member having a non-planar top surface.

6. The method of manufacturing a light emitting device according to claim 1, wherein
   the providing of the light emitting structure includes providing an adhesive member between the top surface of the light emitting element and the bottom surface of the wavelength conversion member.

7. The method of manufacturing a light emitting device according to claim 1, wherein
   the providing of the light emitting structure includes
   providing the light emitting element with a pair of positive and negative electrodes being arranged on a bottom surface of the light emitting element, and
   supplying the reflecting member to cover the bottom surface of the light emitting element and lateral surfaces of the electrodes.

* * * * *

UNITED STATES PATENT AND TRADEMARK OFFICE
CERTIFICATE OF CORRECTION

| | | |
|---|---|---|
| PATENT NO. | : 12,336,344 B2 | Page 1 of 1 |
| APPLICATION NO. | : 18/446382 | |
| DATED | : June 17, 2025 | |
| INVENTOR(S) | : Hirosuke Hayashi | |

It is certified that error appears in the above-identified patent and that said Letters Patent is hereby corrected as shown below:

On the Title Page

Item (73) delete:
"NISSAN NORTH AMERICA, INC., Franklin, TN (US)"

And insert:
-- NICHIA CORPORATION, Anan-shi, JAPAN --

Signed and Sealed this
Twenty-ninth Day of July, 2025

Coke Morgan Stewart
*Acting Director of the United States Patent and Trademark Office*